United States Patent

Richeson, Jr. et al.

[15] 3,656,151

[45] Apr. 11, 1972

[54] DIGITAL FUNCTION GENERATION NETWORK

[72] Inventors: William E. Richeson, Jr.; Mike B. Feher, both of Fort Wayne, Ind.

[73] Assignee: The Magnavox Company, Fort Wayne, Ind.

[22] Filed: Mar. 26, 1970

[21] Appl. No.: 22,958

[52] U.S. Cl. ....................340/347 DA, 235/92 MB

[51] Int. Cl. ....................H03k 13/04

[58] Field of Search....................235/92 MB, 197, 154; 340/347 DA

[56] References Cited

UNITED STATES PATENTS

| | | | |
|---|---|---|---|
| 2,993,202 | 7/1961 | Halonen | 340/347 |
| 3,541,354 | 11/1970 | Basham | 340/347 X |
| 3,325,805 | 6/1967 | Dorey | 340/347 |
| 3,241,133 | 3/1966 | Herzl | 340/347 |
| 3,299,419 | 1/1967 | Kumm et al. | 340/347 |
| 3,396,380 | 8/1968 | Ohashi | 340/347 |
| 3,397,396 | 8/1968 | Kaneko | 340/347 |
| 3,504,362 | 3/1970 | Feldmann | 340/347 |

*Primary Examiner*—Daryl W. Cook
*Assistant Examiner*—Joseph M. Thesz, Jr.
*Attorney*—Richard T. Seeger

[57] ABSTRACT

A scheme for transforming input digital information into output analog information where the output is a specified and not necessarily linear function of the input is disclosed. In its simplest form, the circuitry for achieving this result consists of a ladder network, a waveshaping impedance, and a signal generator connected in series. Each rung of the ladder network is a series impedance and gate circuit associated with a specified digital position in the input code and the corresponding impedance is weighted as a function of its positional significance. An output operational amplifier may optionally be provided which serves to invert and appropriately shift the output signal to achieve the desired output waveform.

5 Claims, 9 Drawing Figures

INVENTORS
WILLIAM E. RICHESON
MIKE B. FEHER
BY Jeffers and Young
ATTORNEYS

INVENTORS
WILLIAM E. RICHESON
MIKE B. FEHER
BY Jeffers and Young
ATTORNEYS

INVENTORS
WILLIAM E. RICHESON
MIKE B. FEHER

BY Jeffers and Young
ATTORNEYS

DIGITAL FUNCTION GENERATION NETWORK

BACKGROUND OF THE INVENTION

This invention relates to a function generator and more especially to a function generator having a digital input and an analog output which analog output may be a logarithmic, exponential or other function of the digital input. Prior art function generators typically are a digital input analog output converter having its output coupled to an analog to analog transformation device to provide the desired waveform output. Analog input analog output devices are known in the prior art and such devices have been successfully utilized to generate complex functions by relying on the nonlinearities inherent in semiconductor devices. One prior art analog input analog output device which transforms a linear input function into a logarithmic output function comprises a ladder network each rung of which is a series resistance and a Zener diode. By appropriately selecting the break down voltages for the several Zener diodes at various points, the effective output of the ladder changes according to the applied input voltage level thus giving the circuit its nonlinear aspect.

SUMMARY OF THE INVENTION

The present invention overcomes the prior art deficiencies by providing a series of switches or gates each responsive to one digital position in an input digital code to connect or not connect a weighted resistor in parallel with the weighted resistances indicative of the other digital positions so as to supply an output analog voltage across this parallel configuration which is the analog of the digital input. Thus, in its simplest form, the invention consists of a ladder network with the resistance associated with the highest order digital position having a value R, the resistance associated with the next highest order digital position having a value of 2R, the next a value of 4R, then 8R etc. with the lowest order digital position being associated with the largest resistance. Each of these resistances is selectively insertable in parallel in the ladder network according to whether the corresponding digital position is a 0 or 1 in the input code. This ladder network is then connected in series with a waveshaping resistor and a voltage source and the output voltage is taken across the ladder network. This output analog voltage may then be shifted and/or inverted (or not) by an operational amplifier to supply the desired output waveform. It can be readily seen that this circuit does not require digital to analog conversion followed by a sophisticated analog to analog conversion. The selected approach is quite insensitive to variations in temperature and other operating conditions and its cost is much less than that of the prior art techniques.

Accordingly, it is one object of the present invention to provide a simple economical and dependable digital to analog transformation.

It is another object of the present invention to provide a function generator responsive to digital input signals which can easily approximate a wide variety of waveform outputs.

It is another object of the present invention to provide a method of approximating logarithmic, exponential and other waveform outputs by appropriately selecting a portion of a hyperbolic like waveform output.

While the present invention has manifold applications, the primary purpose of developing the network was to serve in a signal processor to shape data. In this environment, the goal is to achieve maximum detectability and presentation of such data representing low level signals and to alter the scale of the recorded data in such a way as to not overdrive a recorder on high level signals and still maintain some level of indication. In this specific environment, another goal was to achieve the desired function in the digital portion of the equipment rather than by analog means so as to reduce costs both in parts and production while increasing the reliability of the system. In this specific environment, a basically logarithmic output was desirable. As noted earlier, there are prior art analog input analog output ladder networks each rung of which comprises a series resistance and Zener diode, the conduction voltages of the several Zener diodes being different, which will effect this specific transformation but such circuits are limited to a specific logarithmic transformation and lack the versatility of the present invention.

Therefore, it is a specific object of the present invention to provide a digital input analog output logarithmic transformation circuit.

It is a still further object of the present invention to provide a circuit for use in a data recorder which emphasizes lower level signals and de-emphasizes higher level signals while maintaining the order of the possible signals according to magnitude.

BRIEF DESCRIPTION OF THE DRAWING

These and other objects and advantages of the present invention will appear more clearly from the following detailed description read in conjunction with the accompanying drawing in which.

DESCRIPTION OF THE PREFERRED EMBODIMENT

Figures 1, 6:
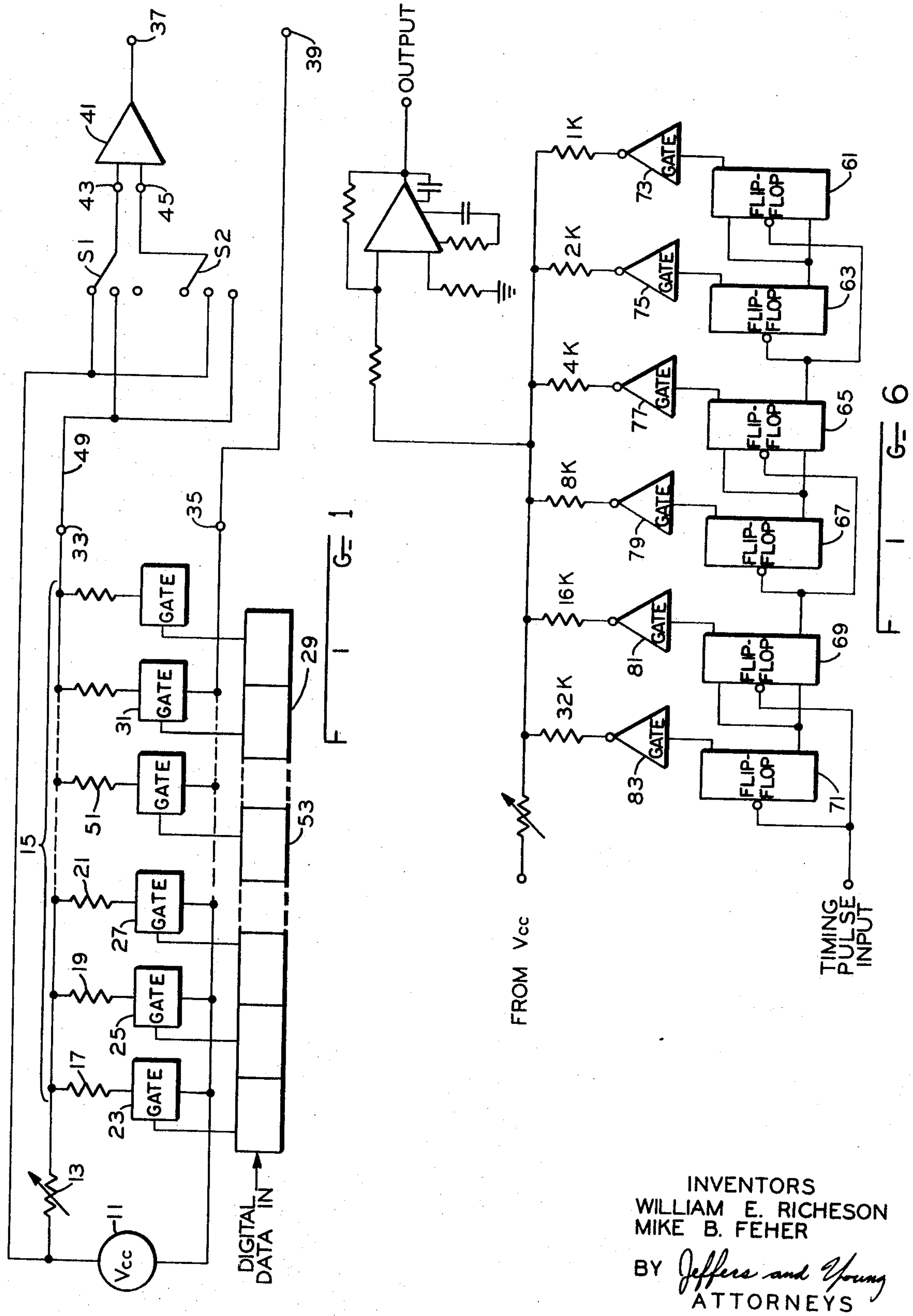
FIG. 1 is a block diagram of a generalized function generator according to the teachings of the present invention.
FIG. 6 shows a specific circuit capable of generating the exponential function.

Turning first to FIG. 1 which is a block schematic diagram illustrating the several principles of the present invention, the circuit is seen to consist of a voltage source 11 in series with a waveshaping impedance 13 and a plurality of parallel impedance paths 15. The number of parallel paths employed may be arbitrarily selected in order to achieve the desired degree of resolution in the function to be generated. These parallel impedance paths 15 form a so-called ladder network and each of the several parallel impedance paths forms a rung of that ladder. Each rung is seen to consist of an impedance such as 17, 19 and 21 connected in series with a gate such as 23, 25 and 27. These gates 23, 25 and 27 are a simple conduct-no conduct gate and each of them is controlled by the status of a corresponding digital position in the register 29. Thus, if the binary number stored in the register 29 were, for example, 101 . . . 10, gates 23, 27 and 31 would be in their conducting status while the remaining gates, that is the gates associated with a zero in the corresponding digital position of the register 29, would be in their nonconducting status. The specific nature of the register 29, that is whether it is a shift register, or a register which is loaded in parallel or serially is quite immaterial as is the specific structure of the gates 23, 25, 27 and 31 and any number of possible circuits might be employed. The important feature is to have a gate in each rung of the ladder which is conducting or nonconducting depending upon the status of the corresponding digit position in the register. The ultimate in simplicity so far as this portion of the circuit is concerned would be to merely have a series of on/off switches in the positions 23, 25, 27 and 31 and to manually set those switches according to the binary number under consideration.

The output of the present circuit may be taken between terminals 33 and 35 or an additional output circuit may be employed in which case the output is between the terminals 37 and 39. This additional output circuitry could consist of an operation amplifier 41 having a "direct" input terminal 43 and an "invert" input terminal 45. The input to the operational amplifier would be supplied by way of line 49. The output of the operational amplifier 41 may be either direct or inverted and may be shifted according to the settings of switches S1 and S2 as will appear more clearly subsequent in the discussion. The voltage source 11 may be a simple direct current source or may be a more complex alternating current source as desired and in a case of a direct current source, the impedances 13, 17, 19 and 21 would be resistive while in the case of some type of alternating current source, these impedances might be resistive or might be some type of reactive impedance.

To make the example of FIG. 1 more specific, let us assume that the voltage source 11 is a direct current supply having magnitude $V_{cc}$ and that each of the impedances 13, 17, 19 and 21 is a resistance. Assume further that resistance 17 is of magnitude R, resistance 19 is 2R, resistance 21 is 4R and at each successive resistance moving toward the right is twice the value of its predecessor. Assume further that the variable resistance 13 is set to have a value of KR. With this assignment of resistance values, the left most digital position in the register 29 is associated with the highest order digit of an input number and each succeeding digital position in the register is associated with the next lower order digit; an arbitrary position in the register 53 representing $2^m$ would have its associated resistance 51 having a magnitude $R(2^{n-1-m})$ assuming a straight binary code of n bits. To state this more simply, each resistance moving toward the right has a value twice that of its predecessor while each digital position in the register moving toward the right has a significance half that of its predecessor. Of course, other assignment of resistance values would be necessary for other digital codes than the assumed pure binary code. For an $n$ bit pure binary code, the resistance encountered by the voltage source 11 would be given by:

$$R_{eq}=KR+\frac{1}{\frac{d_{n-1}}{R}+\frac{d_{n-2}}{2R}+\frac{d_{n-3}}{4R}+\ldots+\frac{d_m}{(2^{n-1-m})R}+\ldots+\frac{d_0}{2^{n-1}R}} \qquad (1)$$

where $d_{n-1}$ is 1 if the highest order digit is a 1 and is 0 otherwise and in general $d_m$ is 1 if the bit stored in register position 53 associated with $2^m$ is a 1 and $d_m$ is 0 otherwise. Algebraic simplification of equation 1 leads to $$R_{eq}=KR+\frac{2^{n-1}}{2^{n-1}d_{n-1}+2^{n-2}d_{n-2}+\ldots+2^m d_m+\ldots+2^0 d_0} \qquad (2)$$

The denominator of the fractional portion of this expression should be readily recognized as precisely the numerical value of the binary number stored in the register 29 and accordingly that expression will be replaced by X which gives $$R_{eq}=KR+(2^{n-1}R/X) \qquad (3)$$

Repeated application of the well known relationship between resistance, current and voltage yields equation 4 which represents the current flowing in the resistance 13 and equation 5 which represents the voltage $e_0$ between terminals 33 and 35.

$$i=\frac{V_{cc}}{KR+\frac{2^{n-1}R}{X}} \qquad (4)$$

$$e_0=\frac{2^{n-1}V_{cc}}{KX+2^{n-1}} \qquad (5)$$

Figure 3:
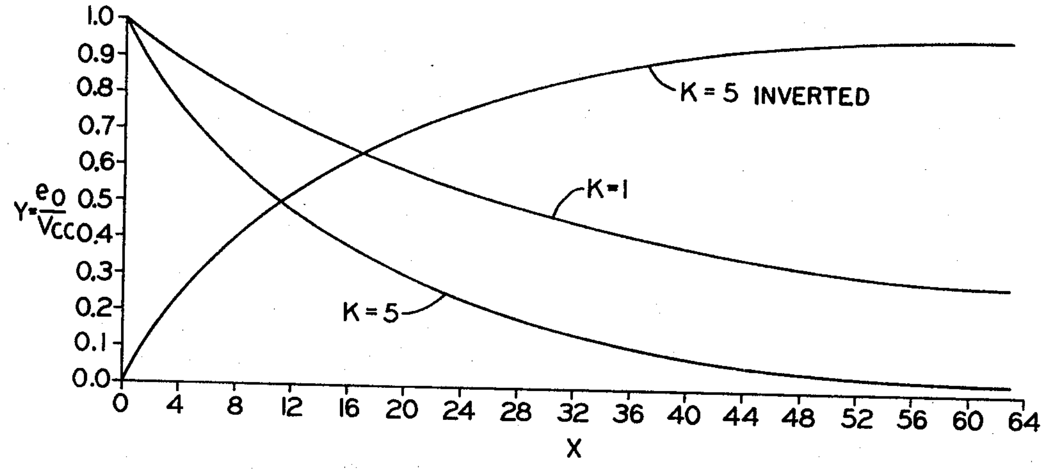
FIG. 3 shows three actual output curves for the circuit of FIG. 1 with digital integral inputs from 0 to 63.
Figure 5A:
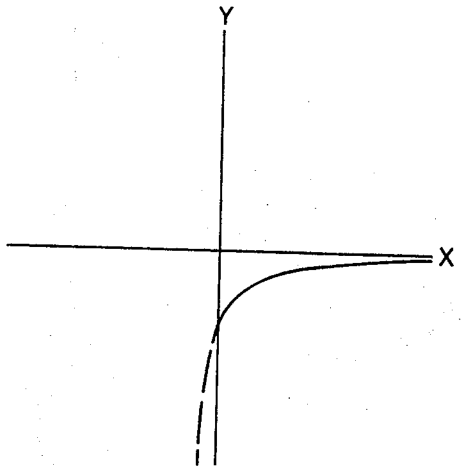
FIGS. 5*a* through 5*d* illustrate the transformations necessary to generate an exponential curve according to the teachings of the present invention.
Figure 5B:
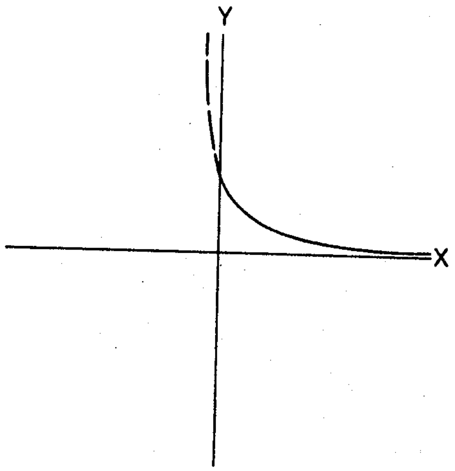
Figure 5C:
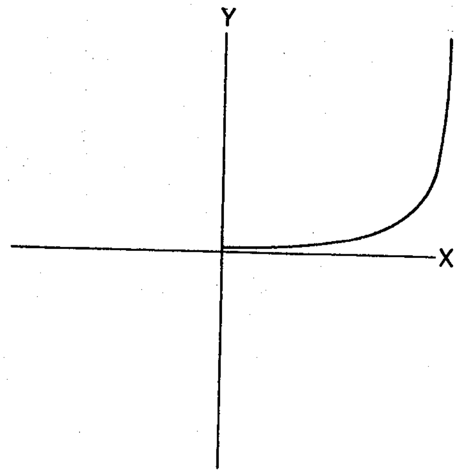
Figure 5D:
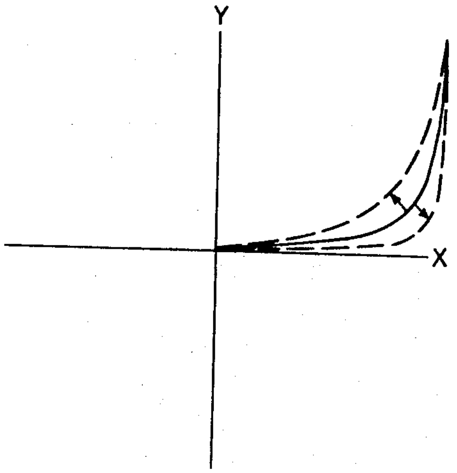

This output may be normalized by any of several well known techniques and in our specific example the arbitrary DC voltage $V_{cc}$ could simply be set to 1 volt giving an output $e_0$ y represented by equation 6 and illustrated in FIG. 3 for a 6 bit binary code having values for K of 1 and 5 by the monotonically decreasing curves.

$$y=(2^{n-1}/KX+2^{n-1}) \qquad (6)$$

FIG. 3 illustrates that the selection of the parameter K determines the curvature or amount of bend in the output function and as will appear later, has the effect of shifting the theoretical vertical asymptote of this curve which occurs for negative values of X.

If we desire to generate a generally logarithmic function similar to that created by the ladder network of resistors and Zener diodes as discussed under the prior art heading, it is necessary to shift the curve and invert it, the shift being generated by putting switch S1 in its upper most position and the inversion taking place in the operational amplifier by putting switch S2 in its lower most position. Under these circumstances the output between terminals 37 and 39 again for a 6 bit binary code and having resistance 13 set so that $K=5$ is shown in FIG. 3 as the monotonically increasing function. Mathematically this shift and inversion is represented by 1 minus the values of $y$ given by equation 6, namely $$y=1-\frac{2^{n-1}}{KX+2^{n-1}}=\frac{KX}{KX+2^{n-1}} \qquad (7)$$

Figure 2:
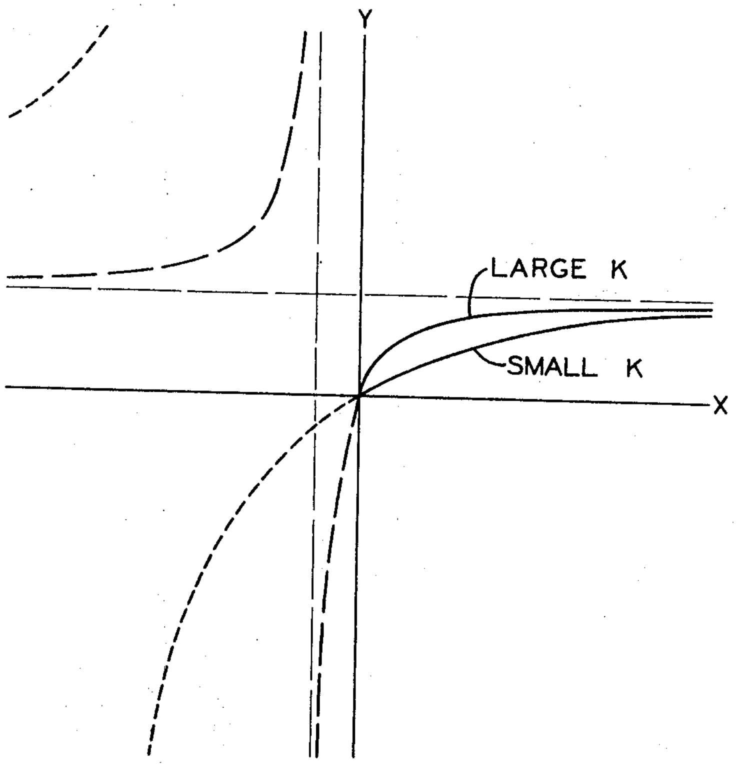
FIG. 2 is a curve illustrating two possible theoretical outputs for the circuit of FIG. 1.
Figure 4:
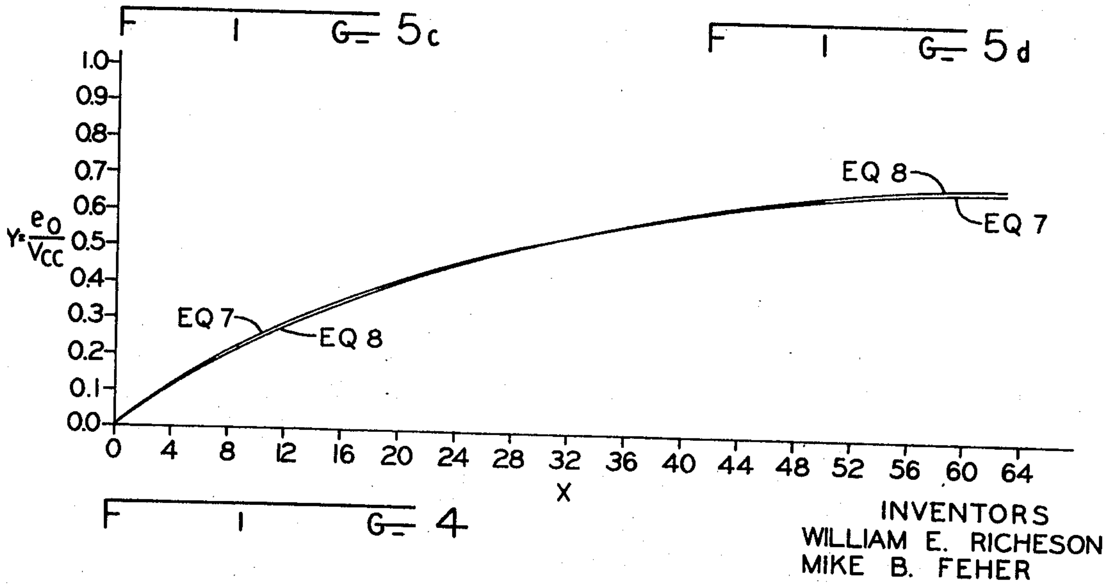
FIG. 4 compares a logarithmic curve and the actual output approximating this logarithmic curve achieved according to the teachings of the present invention.

The function represented by equation 7 is the well known hyperbola as illustrated in FIG. 2 for relatively large and relatively small values of $K$. It can clearly be seen that adjusting the parameter $K$ has the effect not only of shifting the vertical asymptote but of materially altering the curvature of the hyperbola. Thus, by picking extremely small values of $K$ the portion of the hyperbola which will be generated by the circuit e.g., for values of $X$ between 0 and 63 may be made essentially linear whereas by picking larger values of the $K$ the output of interest may be made to closely approximate a logarithmic curve. The logarithmic curves of equation 8 and equation 7 for a value of $K=1$ have been compared in FIG. 4 which illustrates that the approximation is indeed a good one. Equation 8 is the specific logarithmic function approximated by equation 7 when $K$=1.

$$y=0.74\log(0.114X+1) \qquad (8)$$

The number of functions which may be generated by the circuit of FIG. 1 is almost limitless since the sequence of digital data inserted in the register 29 need not necessarily be a simple increasing count and since the bias introduced in the operational amplifier which controls the horizontal asymptote of the hyperbola of FIG. 2 may be any specified amount. For example, suppose it is desired to generate an exponential waveform according to the teachings of the present invention. The function of FIGS. 2 and 5 are generally present in the equipment only for positive values of $X$ but the left half plane is also illustrated for a more complete understanding. Taking the function of FIG. 2 as a starting point which it should be recalled corresponds to equation 7 which in turn corresponds to switch S1 being in its upper most position, we first shift the function downward so as to cause its horizontal asymptote to correspond to the X axis. This is achieved by moving switch S1 to its lower most position so as to remove the bias on the operational amplifier 41 and is illustrated in FIG. **5*a*. The next step is to invert the waveform to that shown in FIG. 5*b* by moving switch S2 to its upper most position and moving switch S1 to its middle position. To effect the transition from FIG. 5*b* to FIG. 5*c*, one substitutes 63–X for X as the independent variable or more simply stated, the sequence of numbers being inserted in the register 29 is merely a counting down e.g., 63, 62, 61 . . . 3, 2, 1, 0 rather than a sequentially increasing count. Now to achieve the desired exponential waveshape $K$ is varied so as to shift the curve toward the left as well as to modify its curvature as illustrated in the transition from FIG. 5*c* to FIG. 5*d*. If it is desired to have the exponential curve of FIG. 5d to pass through or not pass through the origin, a new bias is inserted on one of the inputs to the operational amplifier. FIG. 6 illustrates a specific circuit designed to generate such an exponential waveform wherein the generalized register 29 of FIG. 1 has been replaced with a series of six flip flops 61, 63, 65, 67, 69 and 71 interconnected so as to count down and eliminate the need of digital data input required by the circuit of FIG. 1. These several flip flops operate the gates 73 through 81 and the remainder of the circuit functions the same as FIG. 1**.

Because of the digital format one can readily alter the response at the circuit to a great family of desired transformations. Thus, while the present invention has been described in reference to a specific embodiment, numerous modifications will suggest themselves to those of ordinary skill in the art and accordingly the scope of the present invention is to be measured only by that of the appended claims.

We claim:

1. A digital to analog converter comprising:

a plurality of conduct-no conduct gates, each adapted to be responsive to the status of one of the digit positions in an input digital code;

a corresponding plurality of impedances, said impedances weighted in accordance with the particular digital code employed, each said impedance forming a series circuit with its corresponding gate and the thus formed plurality of gate-impedance circuits forming a plurality of parallel paths;

a voltage source;

a selectively variable waveshaping impedance, said voltage source said waveshaping impedance and said plurality of parallel paths forming a series circuit; and output means comprising an operational amplifier and responsive to the analog signal across said plurality of parallel paths to selectively shift and to selectively invert said analog signal so as to provide an analog output representation of a function of the digital input.

2. The converter of claim 1 wherein the digital code is a straight binary code of n bits and wherein if the impedance associated with the highest order bit gate is Z, then the impedance associated with the gate representing $2^m$ is $Z(2^{n-1-m})$ where $0 \geqslant m<n$.

3. A circuit for generating an approximation to an arbitrary analog output waveform in response to a set of digital input signals comprising:

digital input means;

circuit means for generating a portion of an approximately hyperbolic output waveform in response to a sequential digital input of the form $n_1=0$ and $n_{i+1}=n_i+1$;

means for selectively shifting said waveform; and means responsive to said circuit means for selectively inverting said waveform wherein said circuit means comprises a ladder network, a signal generator, and a waveshaping impedance connected together in series, the output of said circuit means being taken across said ladder network.

4. The circuit of claim 3 wherein said ladder network comprises a series of rungs, each rung comprising a series impedance and gate, said gate responsive to a specified digit of said digital input signal.

5. The circuit of claim 4 wherein if the impedance in the rung associated with the highest order bit is Z then the impedance associated with the rung representing $2^m$ is $Z(2^{n-1-m})$ where $0 \geqslant m<n$.

* * * * *